(12) United States Patent
Yano et al.

(10) Patent No.: US 6,198,208 B1
(45) Date of Patent: Mar. 6, 2001

(54) THIN FILM PIEZOELECTRIC DEVICE

(75) Inventors: Yoshihiko Yano; Takao Noguchi; Hidenori Abe; Hisatoshi Saitou, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/558,586

(22) Filed: Apr. 26, 2000

(30) Foreign Application Priority Data

May 20, 1999 (JP) .................................................. 11-139997

(51) Int. Cl.[7] .............................. H01L 41/04; B32B 3/02; B32B 15/06
(52) U.S. Cl. .......................... 310/358; 428/466; 428/65.8
(58) Field of Search ..................................... 310/358, 334; 428/653

(56) References Cited

U.S. PATENT DOCUMENTS

| | | |
|---|---|---|
| 5,753,934 | 5/1998 | Yano et al. . |
| 5,801,105 | 9/1998 | Yano et al. . |
| 5,810,923 | 9/1998 | Yano et al. . |
| 5,828,080 | 10/1998 | Yano et al. . |
| 5,919,515 * | 7/1999 | Yano et al. ......................... 428/65.8 |
| 5,955,213 | 9/1999 | Yano et al. . |
| 5,985,404 * | 11/1999 | Yano et al. ......................... 428/65.8 |
| 6,013,970 * | 1/2000 | Nishiwaki ............................ 310/358 |
| 6,096,434 * | 1/2000 | Yano .................................. 428/446 |
| 6,097,133 * | 8/2000 | Shimada ............................. 310/330 |

FOREIGN PATENT DOCUMENTS 9-110592   4/1997   (JP) .

OTHER PUBLICATIONS

S. P. Alpay, et al., "Effect Of The Electrode Layer On The Polydomain Structure of Epitaxial $PbZr_{0.2}Ti_{0.8}O_3$ Thin Films," Journal of Applied Physics, vol. 85, No. 6, (Mar. 15, 1999), pp. 3271–3277.

Xiao–hong DU, et al., "Crystal Orientation Dependence of Piezoelectric Properties in Lead Zirconate Titanate: Theoretical Expectation For Thin Films," Jpn. J. Appl. Phys, vol. 36, Part 1, No. 9A, (Sep. 1997), pp. 5580–5587.

* cited by examiner

Primary Examiner—Nestor Ramirez
Assistant Examiner—Karen B Addison
(74) Attorney, Agent, or Firm—Oblon, Spivak, McClelland, Maier & Neustadt, P.C.

(57) ABSTRACT

A thin film piezoelectric device has an epitaxial metal thin film (4) on a silicon substrate (2) and a PZT thin film (5) on the metal thin film, the PZT thin film (5) having a Ti/(Ti+Zr) atomic ratio between 0.65 and 0.90. A film bulk acoustic resonator having an extremely broad band is realized.

3 Claims, 4 Drawing Sheets

THIN FILM PIEZOELECTRIC DEVICE

This invention relates to thin film piezoelectric devices for constructing thin film oscillators for mobile communications, thin film voltage-controlled oscillators (VCO), thin film filters, and liquid injectors.

BACKGROUND OF THE INVENTION

To meet the recent rapid expansion of the mobile communication market and the demand for multi-functional communication service, new communication systems as typified by IMT2000 have been successively proposed and introduced. There is a tendency for the utility frequency to rise to several giga-hertz and for the frequency bandwidth to increase from 5 MHz to 20 MHz and higher. While the size and power consumption of portable equipment are being reduced, surface acoustic wave (SAW) devices are mainly used as the RF and IF filters. To comply with the new system, the SAW devices are also required to have a higher frequency, broader band, lower loss, and lower cost. Heretofore, SAW devices have cleared the rigorous specification requirements of users through improvements in device design technology and manufacturing technology. Such performance improvement is approaching the limit. This implies that the SAW device will need a substantial technical innovation in the future.

Apart from the development of SAW devices, film bulk acoustic resonators (FBAR) constructed by piezoelectric thin films are capable of basic resonance in a giga-hertz band. However, few outstanding advances have been made on FBAR because it was difficult to prepare piezoelectric thin films of quality and the working precision of piezoelectric thin films and substrates on which they are formed could be increased only a little. However, if filters are constructed using FBAR, miniaturization, low-loss, broadband operation in the giga-hertz band, and monolithic integration with semiconductor integrated circuits would become possible. Therefore, FBAR is of potential worth in the drive to realize very small size portable equipment.

PZT is a lead zirconate titanate ($PbZrO_3$—$PbTiO_3$) solid solution. It is a ferroelectric material having high piezoelectricity. The use of PZT has a possibility of realizing FBAR capable of broad-band operation in a high frequency band. For example, Jpn. J. Appl. Phys., Vol. 36 (1997), pp. 6069–6072, reports FBAR using a polycrystalline PZT thin film formed by the sol-gel method. The PZT thin film described in this report has the composition: $Pb(Zr_{0.52}Ti_{0.48})O_3$.

However, the FBAR described in this article fails to provide resonant characteristics unless a bias voltage is applied to the PZT thin film to induce polarization. The resonant characteristics achieved thereby are insufficient to enable low-loss, broad-band operation in a high frequency band of giga-hertz order. It is thus necessary to improve the electromechanical coupling constant of the PZT thin film.

Studying the epitaxial growth of PZT thin films on silicon substrates, the inventors proposed in JP-A 9-110592 and 10-223476 a method for the epitaxial growth of a PZT thin film on a silicon substrate. The construction of a FBAR device using a PZT thin film is not considered in these patent publications.

Japanese Patent No. 2,568,505 discloses to form $PbTiO_3$ and La-added $PbTiO_3$ rather than PZT on MgO single crystal substrates as highly oriented thin films. In this patent, pyroelectric properties of these oriented films are under consideration. Given a high degree of orientation, greater outputs are obtained without a need for poling. The application of such oriented films to FBAR is not referred to in this patent. For the construction of FBAR, the substrate must be worked to a high precision, and a piezoelectric thin film must be formed on a silicon substrate rather than the MgO substrate used in the above patent, in order to enable monolithic integration with semiconductor circuits.

As discussed above, no study has been made on the application of PZT thin film to FBAR. Namely, a FBAR based on a combination of a PZT thin film with a silicon substrate and possessing satisfactory resonant characteristics for broad-band operation is unknown.

SUMMARY OF THE INVENTION

Therefore, an object of the invention is to provide a thin film piezoelectric device from which a FBAR operating over an extremely broad band as compared with the prior art is realized.

We have found that resonant characteristics of a FBAR having an epitaxially grown PZT thin film on a silicon substrate as the piezoelectric thin film largely depend on the composition of the PZT thin film. By adjusting the atomic ratio of Ti/(Ti+Zr) so as to fall within a specific range, a FBAR operating over an extremely broad band can be realized without a need for poling of the PZT thin film.

The invention provides a thin film piezoelectric device comprising a silicon substrate, a metal thin film in the form of an epitaxial film on the substrate, and a PZT thin film on the metal thin film. The PZT thin film has a Ti/(Ti+Zr) atomic ratio of from 0.65/1 to 0.90/1. Preferably, the PZT thin film is a 90 degree domain structure epitaxial film having (100) orientation and (001) orientation mixed. Typically, the thin film piezoelectric device constitutes a film bulk acoustic resonator (FBAR).

In the disclosure, Ti/(Ti+Zr) always refers to an atomic ratio.

DESCRIPTION OF THE PREFERRED EMBODIMENT

Figure 1:
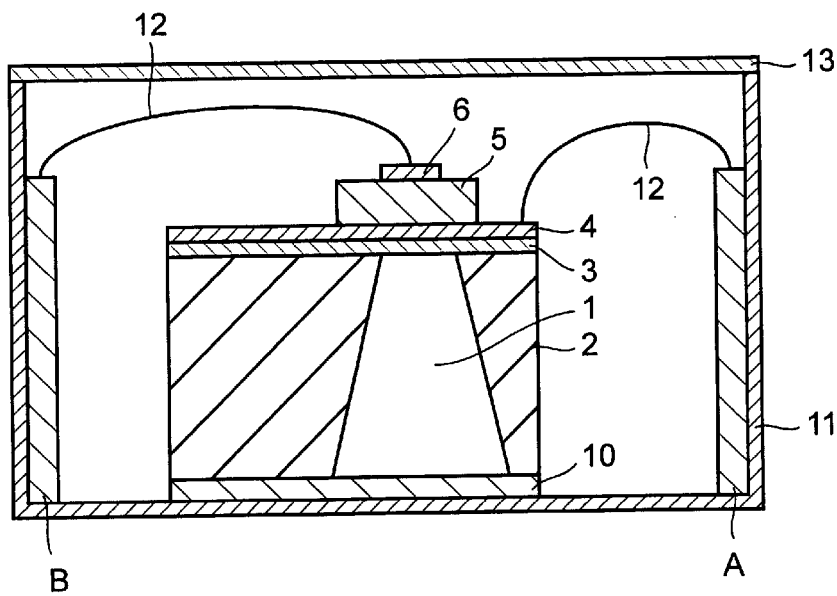
FIG. 1 is a schematic cross-sectional view of a typical FBAR.

In general, piezoelectric characteristics of a piezoelectric material depend on the magnitude of polarization of crystals, the alignment of polarization axis and other factors. It is believed that the piezoelectricity of the PZT thin film used herein also depends on the crystallographic properties including domain structure, orientation and crystallinity of crystals constituting the thin film. Before the crystallographic properties of a PZT thin film are discussed, the nomenclature used in this disclosure is described.

The "unidirectionally oriented film" used herein means a crystallized film in which desired crystal faces are aligned parallel to the substrate surface. For example, a (001) unidirectionally oriented film is a film in which (001) faces extend substantially parallel to the film surface. Specifically, on analysis by x-ray diffractometry, the reflection peak intensity from faces other than the objective face is less than 10%, and preferably less than 5% of the maximum peak intensity of the objective face. For example, in the case of a (00L) unidirectionally oriented film, that is, c-face unidirectionally oriented film, the reflection intensity from faces other than the (00L) face is less than 10%, and preferably less than 5% of the maximum peak intensity of reflection from the (00L) face as analyzed by 2θ-θ x-ray diffraction. It is noted that the (00L) face generally designates the (001) family faces, that is, those equivalent faces such as (001) and (002) faces. It is also noted that the (H00) face generally designates those equivalent faces such as (100) and (200) faces.

The term "epitaxial film" used herein is a unidirectionally oriented epitaxial film. The unidirectionally oriented epitaxial film is a unidirectionally oriented film (as defined above) in which crystals be oriented in alignment in all the directions of X, Y, and Z axes, provided that the film surface is a X-Y plane and the film's thickness direction is Z axis. Illustratively stated, it is first required that on analysis by x-ray diffractometry, the reflection peak intensity from faces other than the objective face be less than 10%, and preferably less than 5% of the maximum peak intensity of the objective face. For example, in the case of a (001) epitaxial film, that is, c-face epitaxial film, the reflection peak intensity from faces other than the (00L) face is less than 10%, and preferably less than 5% of the maximum peak intensity of reflection from the (00L) face as analyzed by 2θ-θ x-ray diffraction. It is secondly required that the epitaxial film exhibit a spotty or streaky pattern as analyzed by RHEED. A film exhibiting a ring or halo pattern as analyzed by RHEED is not regarded as being epitaxial. It is understood that RHEED is an abbreviation of reflection high energy electron diffraction and the RHEED analysis is an index of the orientation of a crystal axis within a film plane.

The "90 degree domain structure epitaxial film" used herein must fulfill the following requirements at room temperature. It is first required that on analysis of a film by 2θ-θ x-ray diffraction, the peak intensity from faces other than (00L) and (H00) faces be less than 10%, and preferably less than 5% of the maximum peak intensity from (00L) or (H00) face. It is secondly required that the film exhibit a spotty or streaky pattern on RHEED analysis.

PZT has an axis of polarization in [001] direction when it consists of tetragonal crystals and in [111] direction when it consists of rhombohedral crystals. PZT ceramics are generally known to assume, at room temperature, tetragonal crystals near or above Ti/(Ti+Zr)=0.5, rhombohedral crystals near or below Ti/(Ti+Zr)=0.4, and a mixture of tetragonal and rhombohedral crystals, known as morphotropic phase boundary (MPB) composition, at Ti/(Ti+Zr) between about 0.4 and about 0.5. Near the MPB composition, the piezoelectric constant is highest and excellent resonant characteristics are exerted. For example, the polycrystalline PZT thin film described in Jpn. J. Appl. Phys., Vol. 36 (1997), pp. 6069–6072, utilizes the MPB composition.

However, for a thin film of PZT formed by epitaxial growth, crystallographic parameters of the film ensuring satisfactory piezoelectricity are unknown. Then we first attempted to form a PZT thin film as a thin film oriented in the direction of an axis of polarization, and more specifically, as a thin film having at least tetragonal (001) oriented crystals. In order to form a tetragonal (001) oriented film, it is important that during growth of a thin film, crystals be oriented in a direction corresponding to that orientation. PZT is tetragonal at room temperature, but becomes cubic at temperatures above 500° C. because the high-temperature phase is cubic. This suggests that if a PZT film can be grown as an epitaxial film of cubic (100) orientation by setting the growth temperature above 500° C., the grown film undergoes transition to a tetragonal system upon cooling, resulting in an epitaxial film of tetragonal (001) orientation or a 90 degree domain structure epitaxial film having (100) orientation and (001) orientation mixed. Whether the PZT thin film becomes a (001) oriented epitaxial film or a 90 degree domain structure epitaxial film is determined by a difference in thermal expansion coefficient between the PZT thin film and the substrate, a difference in lattice constant between the PZT thin film and the underlying layer (which is the metal thin film in the present invention), and the lattice constant of the PZT thin film itself.

We studied how the resonant characteristics of a FBAR of the construction shown in FIG. 1 depend on the crystallographic parameters of a PZT thin film.

The FBAR illustrated includes a silicon (100) single crystal substrate 2 (simply referred to as Si substrate, hereinafter) having a via hole 1 formed therein, a buffer layer 3 of 50 nm thick consisting of silicon oxide, zirconium oxide and yttrium oxide layers on the Si substrate 2, an underlying electrode 4 of platinum and 100 nm thick, a PZT thin film 5 of 0.5 μm thick, and an upper electrode 6 of gold and 100 nm thick, which are stacked in the described order. The via hole 1 is formed by anisotropic etching of the Si substrate from the lower side in the figure. Due to the presence of the via hole 1, the thin films stacked on the Si substrate construct a diaphragm. The lower surface of the Si substrate 2 is bonded to the bottom of a package 11 with a die bonding agent 10 while the top of the package 11 is closed by a lid 13. This structure was fabricated by forming thin films and electrodes on a Si substrate, effecting etching, and dicing into chips by means of a dicing tool, and mounting the chip in a package. Disposed within the package 11 are external connection terminals A and B for connection to the outside, which are electrically connected to the underlying and upper electrodes 4 and 6 through wires 12, respectively. In this FBAR, the PZT thin film 5 above the via hole 1 constitutes a piezoelectric bulk acoustic resonator with the underlying and upper electrodes 4 and 6 sandwiching the PZT thin film 5.

The underlying electrode 4 was formed by evaporation. The PZT thin film 5 was formed by depositing a film over the entire upper surface of the Si substrate 2 by a multi-source evaporation process, and partially etching away the film other than the region above the via hole 1 by photolithography. The composition of the PZT thin film 5 was set within the range of Ti/(Ti+Zr) between 0.3 and 1.0. The upper electrode 6 was formed above the via hole 1. The upper electrode 6 was rectangular in shape and had a planar size of 25 μm×50 μm.

During the FBAR fabrication, it was confirmed by x-ray diffractometry and RHEED that the underlying electrode 4 was a (001) oriented epitaxial film. Specifically, on RHEED analysis, a streaky pattern appeared. In 2θ-θ x-ray diffraction, the peak intensity from faces other than the (00L) face is less than the detection limit, that is, less than 0.1% of the maximum peak intensity from the (001) face.

It was similarly confirmed that within the range of Ti/(Ti+Zr) between 0.5 and 1.0, the PZT thin film 5 was a (001) oriented epitaxial film of perovskite structure or a 90 degree domain structure epitaxial film having (100) and (001) orientations mixed. Specifically, on RHEED analysis, a streaky pattern appeared in either thin film. In 2θ-θ xray diffraction of the (001) oriented film, the peak intensity from faces other than the (00L) face is less than the detection limit, that is, less than 0.1% of the maximum peak intensity from the (001) face. For the 90 degree domain structure film, the peak intensity from faces other than the (00L) and (H00) faces is less than the detection limit, that is, less than 0.1% of the maximum peak intensity from the (001) face. On the other hand, for those PZT thin films 5 having a Ti/(Ti+Zr) of less than 0.5, their RHEED pattern was ring-like.

With respect to the PZT thin film 5 of this FBAR, the relationship of composition to crystallographic parameters is described based on experimental results.

From compositions with a Ti/(Ti+Zr) of less than 0.4, highly crystalline PZT thin films could not be formed because of a substantial mismatch in lattice constant between Pt and PZT. For example, PZT with a Ti/(Ti+Zr) of 0.4 has a lattice constant of 0.409 nm at the growth temperature of 600° C., whereas a Pt thin film epitaxially grown on a Si substrate has a lattice constant of 0.394 nm at the growth temperature. Since the mismatch is as large as 3.8%, good crystallinity is not achieved. With a Ti/(Ti+Zr) of less than 0.4, the mismatch becomes larger. By contrast, with a Ti/(Ti+Zr) in excess of 0.4, the mismatch becomes smaller, enabling epitaxial growth of a satisfactory PZT thin film. It is noted that PZT with a Ti/(Ti+Zr) of 1.0 gives a mismatch of 0.75%.

Figure 2:
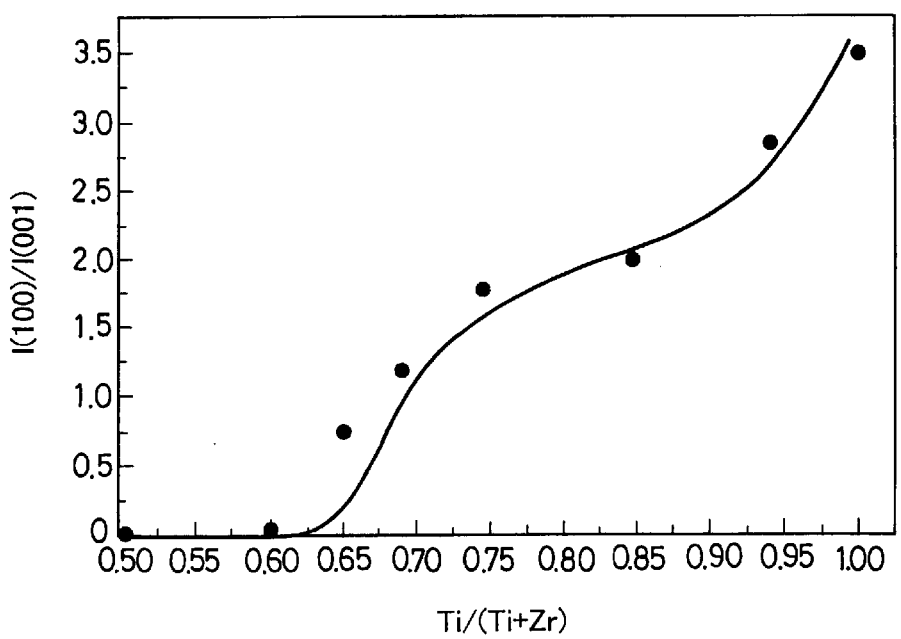
FIG. 2 is a graph showing I(100)/I(001) of an epitaxially grown PZT thin film as a function of its composition.

PZT thin films with a Ti/(Ti+Zr) of at least 0.5 were analyzed by x-ray diffractometry to examine the ratio of the reflection intensity I(100) of (100) face to the reflection intensity I(001) of (001) face. The results are shown in FIG. 2. It is seen from FIG. 2 that the films are (001) unidirectionally oriented when the Ti/(Ti+Zr) is lower than 0.6. On the other hand, when the Ti/(Ti+Zr) is 0.6 or higher, the films are 90 degree domain structure films, indicating that the higher the Ti ratio, the more 30 increases the "a" domain. In PZT crystals, the ratio of a-axis to c-axis (tetragonality) increases as the Ti ratio becomes higher. It is believed that compositions with high tetragonality invite a drastic increase of the "a" domain because of a greater difference in lattice constant between a-axis and c-axis.

Figure 3:
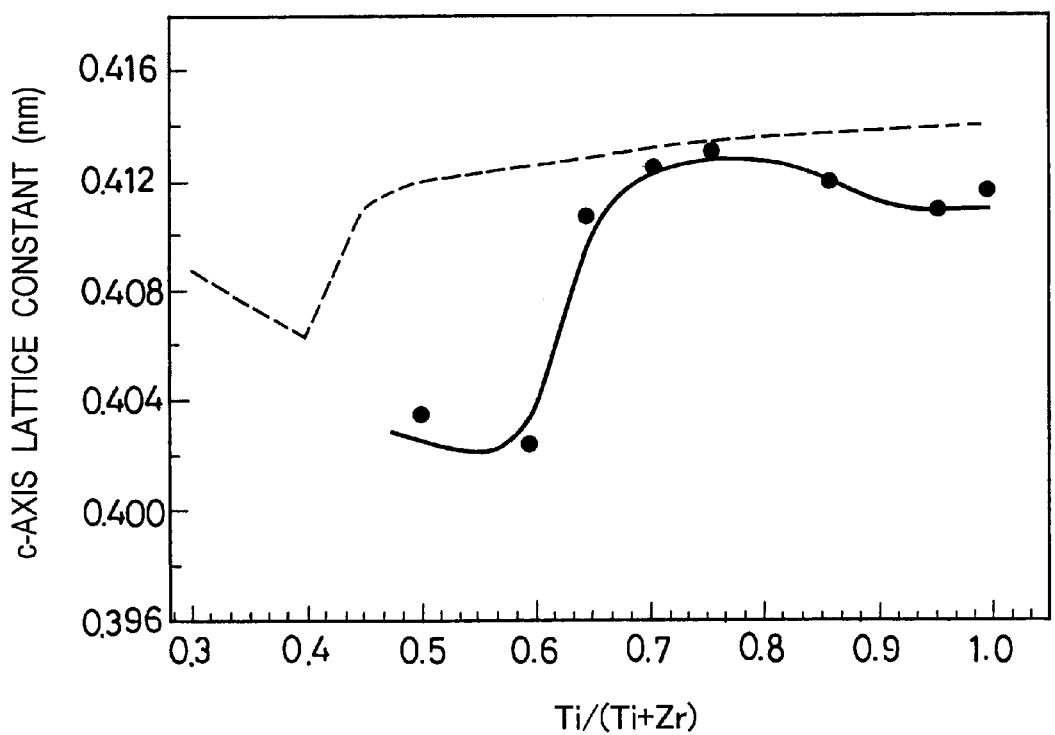
FIG. 3 is a graph showing c-axis lattice constant of (001) oriented crystal in an epitaxially grown PZT thin film as a function of its composition.

For PZT thin films of different compositions, the c-axis lattice constant of (100) oriented crystals was Measured, with the results shown in FIG. 3. In FIG. 3, the broken line curve represents the c-axis lattice constant of PZT ceramics. Since ceramics, unlike thin films, do not receive stresses dependent on the lattice constant of the underlying layer, the broken line curve represents a substantially intrinsic lattice constant. At a Ti/(Ti+Zr) of 0.6 or lower, the c-axis is short as seen from FIG. 3 although the film is a (001) unidirectionally oriented film as shown in FIG. 2. In this compositional region, owing to the difference of thermal expansion coefficient from the Si substrate, the a-axis is stretched during the cooling step following the epitaxial growth, and as a result, the c-axis becomes shorter than the a-axis. At a Ti/(Ti+Zr) of 0.65 or higher, high tetragonality is exerted as shown in FIG. 2. Then, a large amount of "a" domain generates so that the stresses due to the difference of thermal expansion coefficient from the Si substrate are mitigated. As a result, the c-axis lattice constant of PZT thin film approaches to the c-axis lattice constant of ceramics as shown in FIG. 3.

Next, resonant characteristics were actually measured between the connection terminals A and B of the above FBAR. When a PZT thin film had a Ti/(Ti+Zr) of 0.5, that is, high (001) orientation, but a low c-axis lattice constant, no resonant characteristics were observed. When a PZT thin film had a Ti/(Ti+Zr) of 1.0, that is, a high c-axis lattice constant, but low (001) orientation, resonant characteristics could not be measured because of current leakage between the terminals A and B. It is understood that a Ti/(Ti+Zr) of 1.0 corresponds to lead titanate.

A composition with a Ti/(Ti+Zr) of about 0.5 is known as the MPB composition in connection with the PZT bulk ceramics as mentioned above. Near the MPB composition, there are available a highest piezoelectric constant and excellent resonant characteristics. However, even resonant characteristics are not observed in an epitaxially grown PZT thin film.

Figure 4:
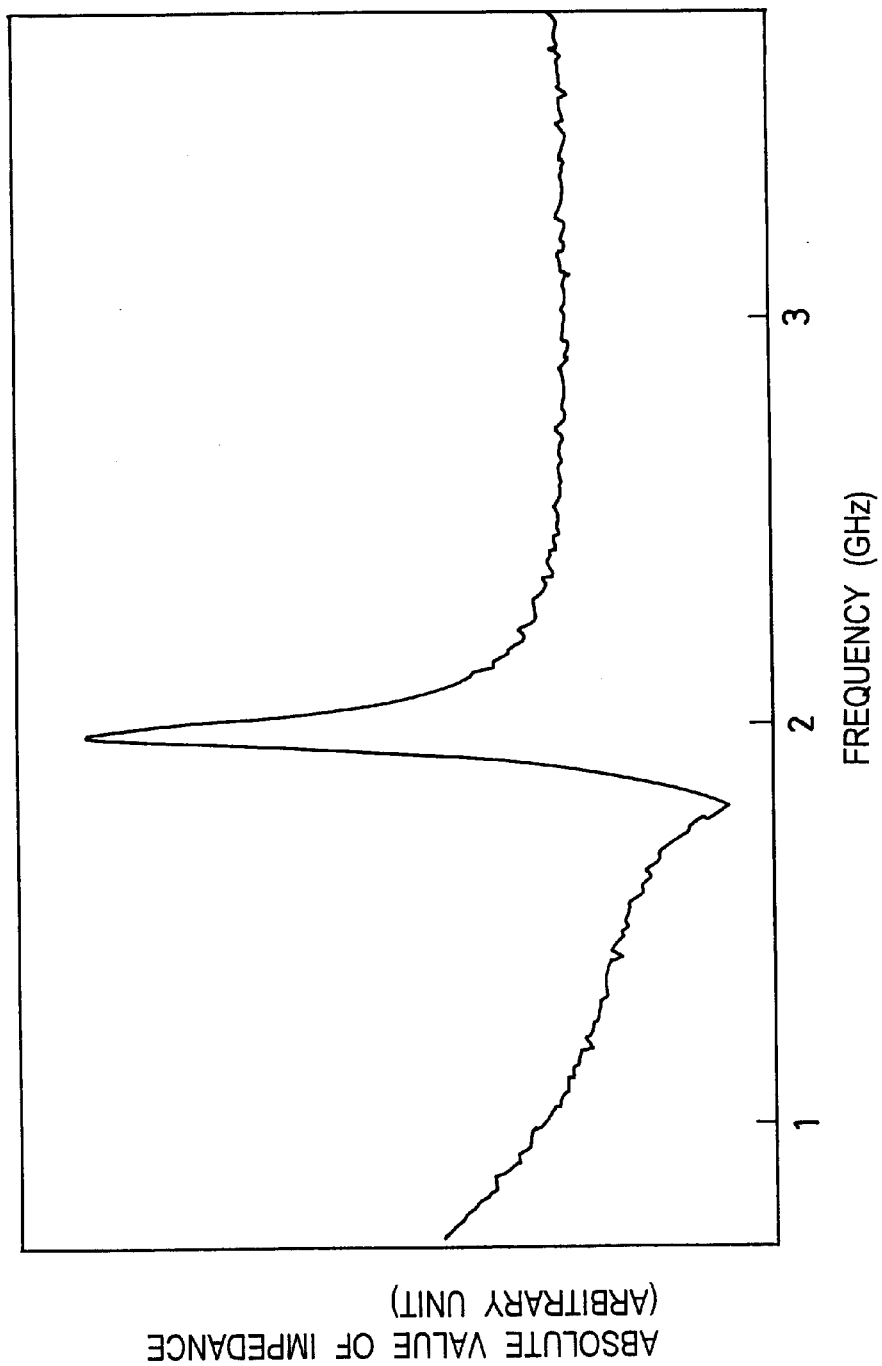
FIG. 4 is a graph showing resonant characteristics of FBAR to which the invention is applied.

Then, measurement was made on FBAR having a PZT thin film with a Ti/(Ti+Zr) of 0.75 to find distinct resonance near 2 GHz. The resonant characteristics are shown in FIG. 4. From the resonance frequency and anti-resonance frequency on this resonant curve, a piezoelectric constant $e_{33}$ and an elastic constant $C_{33}$ were determined to find $e_{33}=14.3$ $C/M^2$ and $C_{33}=8.8\times10^{10}$ $N/m^2$, indicating a very high value of $e_{33}$. Further, from the results of measurement of the dependency of a capacitance on an electrode area, this PZT thin film was estimated to have a dielectric constant of about 300. From these values, the square of an electromechanical coupling constant k was determined to be $k^2=47\%$, which is at least 10 folds of the prior art value. Utilizing this performance, a FBAR operating over an extremely broad band can be established.

By examining resonant characteristics of PZT thin film while varying the composition thereof over a wide range, an appropriate compositional range of PZT thin film was sought for. It has been found that in order for a 90 degree domain structure epitaxial film of PZT to exert excellent resonant characteristics, the Ti/(Ti+Zr) must fall in the range between 0.65 and 0.90, and preferably between 0.70 and 0.85. That is, PZT thin films with a Ti/(Ti+Zr) of 0.65, 0.70, 0.75, 0.80, 0.85, and 0.90 were actually examined for resonant characteristics. All these FBAR's were observed to have resonant characteristics and exhibited good piezoelectricity as demonstrated by a piezoelectric constant $e_{33}$ of at least 10 $C/m^2$ and an electromechanical coupling constant $k^2$ of at least 30%. In particular, the FBAR's with a Ti/(Ti+Zr) of 0.70, 0.75, 0.80, and 0.85 exhibited excellent piezoelectric characteristics as demonstrated by a piezoelectric constant $e_{33}$ of at least 14 $C/m^2$ and an electromechanical coupling constant $k^2$ of at least 40%.

It is evident from the above results that the cbmpositional range in which an epitaxially grown PZT thin film exhibits piezoelectricity when constructed as FBAR is not analogized from the preferred compositional ranges known for ceramics (bulk materials) and polycrystalline thin films. In FBAR using an epitaxially grown PZT thin film, better properties that are never attained in the prior art are obtained by shifting the Ti/(Ti+Zr) of the PZT thin film from the optimum composition for bulk ceramics.

We suppose that the composition dependency of piezoelectricity of a PZT thin film exhibits a completely different behavior from PZT ceramics for the following reason. It is believed that the requirements for a PZT thin film to exhibit excellent piezoelectricity are two:

(i) that spontaneous polarization Ps is aligned in one direction, that is, (001) orientation is high, and (ii) that spontaneous polarization Ps is noticeable, that is, the c-axis lattice constant is high. However, the results shown in FIGS. 2 and 3 suggest that it is impossible for an epitaxially grown PZT thin film to simultaneously satisfy the two requirements. It is then believed that, FBAR having an epitaxially grown PZT thin film on a Si substrate with a Pt thin film (which is also an epitaxial film) interposed therebetween exhibits excellent resonant characteristics when the composition of the PZT thin film is selected to satisfy the above requirement (i) to some extent and at the same time, the above requirement (ii) to some extent.

Based on this understanding, the reason of limitation of Ti/(Ti+Zr) by the invention is explained as follows. It is believed that if Ti/(Ti+Zr) is lower than 0.65, the PZT thin film assumes just or approximately (001) unidirectional orientation, but the c-axis is contracted, failing to provide piezoelectricity. If Ti/(Ti+Zr) is lower than 0.4, the mismatch of lattice constant between the PZT thin film and the substrate increases to impede good epitaxial growth. It is further believed that at a Ti/(Ti+Zr) in excess of 0.90, the c-axis of (001) oriented crystals is fully stretched, but the PZT of this composition has a substantial difference in lattice constant between the a-axis and the c-axis, and as a result, lattice defects occur along domain boundaries in the PZT thin film now converted to the domain structure, causing electric leakage between the upper and underlying electrodes.

Construction of respective components of thin film piezoelectric device

Next, the construction of respective components of the thin film piezoelectric device according to the invention is described in further detail.

Substrate

The invention uses silicon as the substrate. It is especially preferred to use a Si substrate such that the substrate surface is defined by the (100) face of Si single crystal, because an epitaxial PZT film having improved properties can be formed thereon. This is also advantageous in that anisotropic etching is effectively utilizable during the via hole-forming step of the FBAR fabricating process. It is noted that axes residing in the respective planes are preferably parallel between the Si substrate and the metal thin film (underlying electrode), PZT thin film and buffer layer to be described later.

Buffer layer

The buffer layer 3 disposed between the metal thin film (underlying electrode 4) and the substrate 2 in FIG. 1 is not essential, though preferred. The buffer layer has the function of helping a metal thin film of quality epitaxially grow on the Si substrate, serves as an insulator, and also serves as an etching stop layer in forming via holes by etching.

In the thin film piezoelectric device of the invention, a metal thin film is formed on the Si substrate at one of a pair of electrodes sandwiching the PZT thin film and also as the layer underlying the PZT thin film. To form a PZT thin film having good crystallinity, the metal thin film must be formed as an epitaxial film close to single crystals. In order to form the metal thin film as an epitaxial film, the method described in JP-A 9-110592 by the same assignee as the present invention is preferably utilized. In this method, a buffer layer including a (001) oriented $ZrO_2$ thin film, stabilized zirconia thin film and rare earth oxide thin film is provided on a Si single crystal substrate, a (001) oriented perovskite layer of $BaTiO_3$ or the like is formed on the buffer layer, and a metal thin film of platinum or the like is formed on the perovskite layer. This method permits the metal thin film to be formed as an epitaxial film. The reason why this method forms the perovskite layer on the buffer layer is that if a Pt thin film is formed directly on the (001) oriented $ZrO_2$ thin film, the platinum takes (111) orientation or becomes polycrystalline, failing to form a (100) unidirectionally oriented film of Pt. The reason why platinum takes (111) orientation on the (001) oriented $ZrO_2$ thin film is that due to a substantial lattice mismatch between $ZrO_2$ (001) face and Pt (100) face, platinum grows on the energy stable (111) face as the growth face rather than epitaxial growth, that is, growth on the (100) face as the growth face.

However, the formation of a perovskite layer is cumbersome, and it is difficult to form a homogeneous perovskite layer having the as-designed composition. More particularly, when a $BaTiO_3$ thin film is formed on a Zr-containing buffer layer as the perovskite layer, there is a likelihood that a material tending to assume (110) orientation such as $BazrO_3$ will form. Furthermore, in the above-referred JP-A 9-110592, an evaporation process of supplying a metal vapor to a substrate surface in an oxidizing gas is employed as the process capable of forming a homogeneous thin film over a large area. When a $BaTiO_3$ thin film is formed by this process, the evaporation amounts of Ba and Ti must be correctly controlled such that Ba:Ti=1:1 is established when deposited on the substrate surface as an oxide.

It is then preferred to utilize the following buffer layer as the buffer layer which enables to form a Pt thin film as an epitaxial film without a need for a $BaTiO_3$ thin film.

This buffer layer is characterized in that the interface with the metal thin film includes a {111} facet surface. It also has the advantage that since the presence of a faceted surface increases the contact area between the buffer layer and the metal thin film, the separation of the metal thin film which can occur during the micromachining step of the FBAR manufacture can be restrained.

Figure 5A:
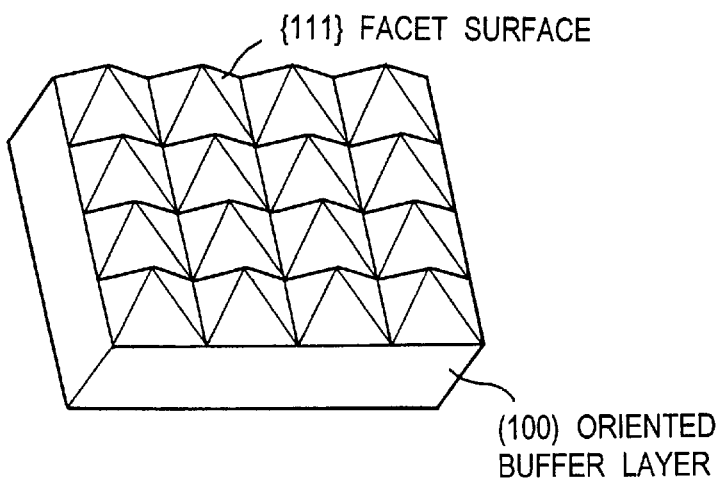
FIG. 5A schematically illustrates a {111} facet surface of a buffer layer.
Figure 5B:
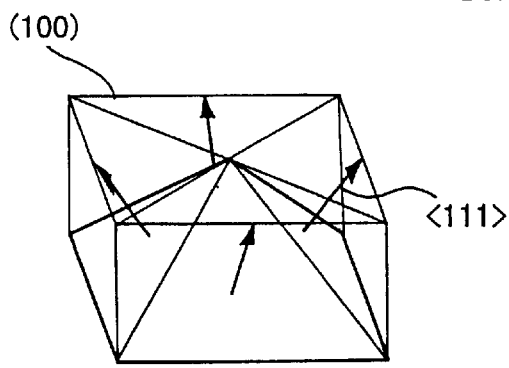
FIG. 5B is an enlarged view thereof, and FIG. 5C schematically illustrates a metal thin film formed on the faceted surface.
Figure 5C:
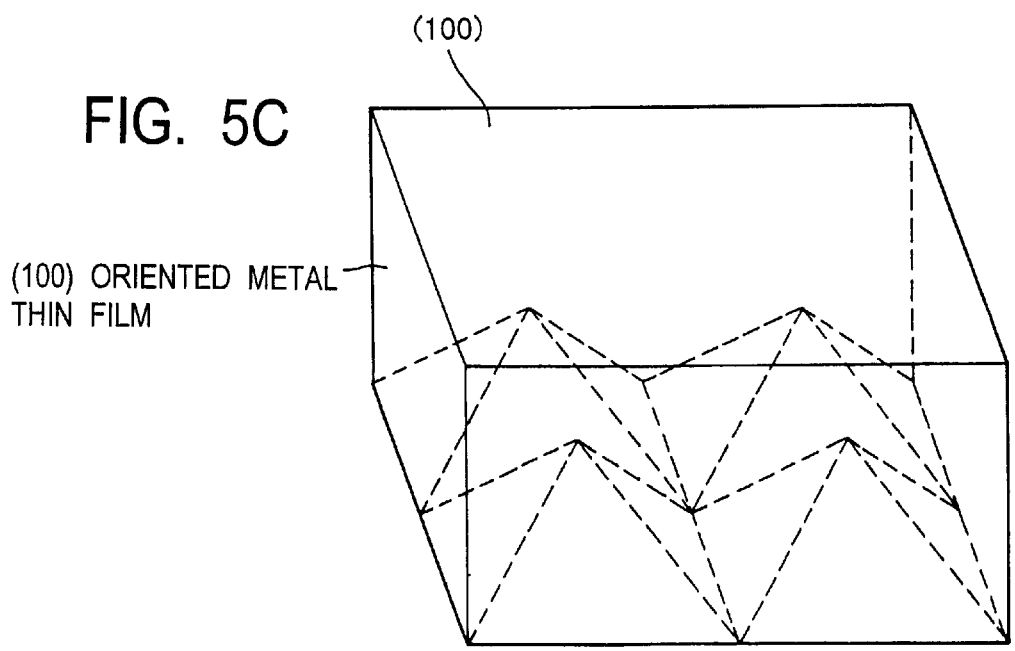

FIG. 5A schematically illustrates a faceted surface on a buffer layer surface. FIG. 5B illustrates the faceted surface in enlargement. Since the buffer layer is an epitaxial film of cubic (100) orientation, tetragonal (001) orientation or monoclinic (001) orientation, this faceted surface is a {111} facet surface. A metal thin film will epitaxially grow on the (111) facet surface of the buffer layer as a {111} oriented film. As the metal thin film grows, depressions defined by the faceted surface are buried. Eventually, the surface of the metal thin film becomes flat as shown in FIG. 5C and parallel to the substrate surface. This surface is a cubic (100) face, but may become a tetragonal (001) face on account of crystal lattice distortion.

The dimensions of the faceted surface are not critical. However, if the height of the faceted surface, that is, the size of the faceted surface when projected on a plane orthogonal to a plane within the buffer layer is too small, the effect of the faceted surface provided on the buffer layer surface is reduced. Then, the projection size is preferably at least 5 nm. If the projection size is large, on the other hand, the surface of the metal thin film does not become flat unless the metal thin film is accordingly made thick. However, the metal thin film becomes more likely to crack as it becomes thick. Then the projection size is preferably up to 30 nm. Understandably, the projection size is determined from a TEM photomicrograph of a buffer layer cross section.

The proportion of the faceted surface at the interface should preferably be at least 80%, and more preferably at least 90%. If the proportion of the faceted surface is too low, it becomes difficult to grow the metal thin film as an epitaxial film of quality. The term "proportion of the faceted surface" as used herein is an area ratio determined from a TEM photomicrograph of a buffer layer cross section by the following procedure. Provided that B is the length of a region of the buffer layer surface to be measured (length in in-plane direction) and H is the total length of surfaces parallel to the in-plane (other than the faceted surface), the proportion of the faceted surface is represented by [1-(H/B)2]. The length B of a region to be measured is at least 1 µm.

To form a {111} facet surface on the surface, the buffer layer is preferably composed mainly of a rare earth oxide, or zirconium oxide, or zirconium oxide in which zirconium is partially replaced by a rare earth element or alkaline earth element. The term "rare earth" is used herein as inclusive of Sc and Y. Such a buffer layer can develop a faceted surface at its surface when it is of cubic (100) orientation or monoclinic (001) orientation.

The composition of the buffer layer is represented by the formula: $Zr_{1-x}R_xO_{2-\delta}$ wherein R stands for a rare earth element or alkaline earth element. While zirconium oxide ($ZrO_2$) corresponding to x=0 undergoes a phase transition of cubic→tetragonal→monoclinic with a temperature change from a high temperature to room temperature, the addition of a rare earth element or alkaline earth element stabilizes the cubic system. An oxide obtained by adding a rare earth element or alkaline earth element to $ZrO_2$ is generally known as stabilized zirconia. Herein, a rare earth element is preferably used as the element for stabilizing $ZrO_2$.

In the practice of the invention, the value of x in the formula: $Zr_{1-x}R_xO_{2-\delta}$ is not critical as long as a faceted surface can be formed. It is noted that Jpn. J. Appl. Phys., 27 (8), L1404–L1405 (1988) reports that rare earth-stabilized zirconia becomes tetragonal or monoclinic crystals in a compositional region wherein x is less than 0.2. Also, J. Appl. Phys., 58 (6), 2407–2409 (1985) reports that in a compositional region leading to a tetragonal or monoclinic system, a unidirectionally oriented epitaxial film is not obtained because oriented faces other than the desired one are introduced in admixture with the desired one. Continuing investigations, we have found that by utilizing an evaporation process to be described later, epitaxial growth is possible and good crystallinity is achievable even with compositions wherein x is less than 0.2. A high purity $ZrO_2$ film has a high insulation resistance and minimized leakage current and is thus preferred when insulating properties are needed. In order to facilitate formation of a faceted surface, it is preferred that x be at least 0.2.

On the other hand, when a buffer layer is formed contiguous to a Si single crystal substrate, the layer in a compositional region wherein x is in excess of 0.75 is of cubic crystals, but is difficult to assume (100) unidirectional orientation, allows (111) oriented crystals to be additionally introduced or rather takes (111) unidirectional orientation. Therefore, when a buffer layer is formed directly on a Si single crystal substrate, it is preferred to set x to be 0.75 or less, especially 0.50 or less in the formula: $Zr_{1-x}R_xO_{2-\delta}$.

It is noted that when a buffer layer is formed on a suitable underlying layer on a Si single crystal substrate, the buffer layer can assume cubic (100) unidirectional orientation even with large values of x. As the underlying layer, a thin film of zirconium oxide or stabilized zirconia and cubic (100) orientation, tetragonal (001) orientation or monoclinic (001) orientation is preferred. For the underlying layer, x should be set smaller than in the buffer layer.

The rare earth element contained in the stabilized zirconia thin film is suitably selected such that the lattice constant of the stabilized zirconia thin film may match with the lattice constant of the thin film or substrate contiguous to the stabilized zirconia thin film. Although the lattice constant of stabilized zirconia can be altered by changing x with the type of rare earth element fixed, the only change of x provides a narrow range of matching adjustment. However, if the rare earth element is changed, matching optimization becomes easy because the lattice constant can be altered over a relatively wide range. For example, the use of Pr instead of Y gives a greater lattice constant.

Notably, oxygen defect-free zirconium oxide is represented by the chemical formula: $ZrO_2$ whereas stabilized zirconia is represented by $Zr_{1-x}R_xO_{2-\delta}$ wherein δ is usually from 0 to 1.0 because the amount of oxygen varies with the type, amount and valence of stabilizing element added.

The buffer layer may have a graded composition structure whose composition changes continuously or stepwise. In the case of the graded composition structure, it is preferred that x in $Zr_{1-x}R_xO_{2-\delta}$ increases from the rear surface side to the front surface side (metal thin film side) of the buffer layer. In the above embodiment wherein an underlying layer is provided, if the underlying layer is considered as part of the buffer layer, this buffer layer is regarded as having a stepwise changing composition.

The rare earth element used in the buffer layer is at least one selected from among Sc, Y, Ce, Pr, Nd, Sm, Eu, Gd, Tb, Dy, Ho, Er, Tm, Yb, and Lu. Since some rare earth oxides are likely to take a rare earth a-type structure which is hexagonal, it is preferred to select a rare earth element which forms a stable cubic oxide. Specifically, at least one element selected from among Sc, Y, Ce, Eu, Gd, Tb, Dy, Ho, Er, Tm, Yb, and Lu is preferable, and a choice may be made among these elements depending on the lattice constant of their oxide and other conditions.

To the buffer layer, an additive may be introduced for property improving purposes. For example, aluminum (Al) and silicon (Si) are effective for improving the resistivity of the film. Also, a transition metal element such as Mn, Fe, Co or Ni can form an impurity level (trapping level) in the film, which can be utilized to control conductivity.

In the $ZrO_2$ thin film used as the underlying layer or buffer layer, the upper limit of the Zr proportion is about 99.99 mol % at the present. Since separation of $ZrO_2$ from $HfO_2$ is difficult with the currently available ultra-purifying technique, the purity of $ZrO_2$ generally indicates the purity of Zr+Hf. Therefore, the purity of $ZrO_2$ in the specification is a value calculated on the assumption that Hf and Zr are identical. However, this gives rise to no problem because $HfO_2$ serves exactly the same function as $ZrO_2$ in the zirconium oxide thin film. This is also true for the stabilized zirconia.

The thickness of the buffer layer is not critical and may be suitably set so that a faceted surface of appropriate size may be formed. Preferably the buffer layer has a thickness of 5 to 1,000 nm, and more preferably 25 to 100 nm. If the buffer layer is too thin, it is difficult to form a uniform faceted surface. If too thick, the buffer layer may crack. The thickness of the underlying layer is suitably determined such that the underlying layer may become a homogeneous epitaxial film, have a flat surface and be free of cracks. A thickness of 2 to 50 nm is often preferred.

Metal thin film

The metal thin film used as the underlying electrode may be an epitaxial film and at the same time, a (100) or (001) oriented film. If a PZT thin film is formed on a metal thin film having good crystallinity and surface smoothness, there can be realized a variety of electronic devices having satisfactory characteristics including film bulk acoustic resonators. Since the metal thin film plays the role of absorbing stresses in the thin film laminate, the metal thin film is also effective for preventing any thin film formed thereon from cracking.

When a buffer layer having a faceted surface is used, a metal thin film being formed on that surface grows while burying the depressions defined by the faceted surface. The metal thin film eventually has a surface which is flat and parallel to the substrate surface. At this point, the metal thin film is a cubic epitaxial film in which (100) face is oriented parallel to the film surface, but may sometimes become an epitaxial film of tetragonal (001) orientation due to stresses causing deformation of crystals.

The metal thin film preferably contains at least one of Pt, Ir, Pd and Rh as a main component and more preferably such a metal element or an alloy containing the same. The metal thin film may also be a thin film consisting of two or more layers of different compositions.

The thickness of the metal thin film varies with a particular application although the metal thin film is preferably 10 to 500 nm and more preferably 50 to 150 nm thick, and so thin as not to damage crystallinity and surface smoothness. More specifically, to bury protrusions and depressions defined by the faceted surface of the buffer layer, the metal thin film should preferably have a thickness of at least 30 nm. A thickness of at least 100 nm ensures a sufficient surface flatness. In order that the metal thin film function as the electrode, a thickness of 50 to 500 nm is preferred.

It is noted that the metal thin film preferably has a resistivity of $10^{-7}$ to $10^3$ $\Omega$-cm, and more preferably $10^{-7}$ to $10^{-2}$ $\Omega$-cm.

PZT thin film

The PZT thin film is an epitaxially grown one as mentioned above, and preferably a 90 degree domain structure epitaxial film having (100) orientation and (001) orientation mixed. The Ti/(Ti+Zr) of the PZT thin film should fall within the above-specified range. The PZT thin film was formed by the multi-source evaporation process in the above example, although it may be formed otherwise, for example, by a MBE or RF magnetron sputtering process. The thickness of the PZT thin film may be suitably set in accordance with the necessary resonance frequency although it is usually selected in the range of 0.05 to 5 am.

In general, PZT designates a solid solution of $PbZrO_3$ and $PbTiO_3$ although the invention does not require that the atomic ratio Pb/(Ti+Zr) be equal to 1. However, it is preferred that the atomic ratio Pb/(Ti+Zr) be from 0.8 to 1.3, and more preferably from 0.9 to 1.2. With Pb/(Ti+Zr) set within this range, good crystallinity is obtainable. The ratio of O to Ti+Zr is not limited to 3. Since some perovskite materials constitute a stable perovskite structure in an oxygen poor or rich state, the atomic ratio O/(Ti+Zr) is usually from about 2.7 to about 3.3. Understandably, the composition of the PZT thin film can be measured by fluorescent x-ray spectroscopy.

In the practice of the invention, the PZT thin film is preferably composed of Pb, Zr, and Ti although it may contain additive elements and impurities. For example, the PZT thin film may have $HfO_2$ incorporated as an impurity since separation of $ZrO_2$ from $HfO_2$ is difficult with the currently available ultra-purifying technique. Notably, the inclusion of $HfO_2$ gives rise to no problem because it has no substantial influence on the properties of the PZT thin film. The additive elements and impurity elements which can be included in the PZT thin film include, for example, rare earth elements (inclusive of Sc and Y), Bi, Ba, Sr, Ca, Cd, K, Na, Mg, Nb, Ta, Hf, Fe, Sn, Al, Mn, Cr, W, and Ru. In the practice of the invention, these substitute elements and impurity elements may be included insofar as the value of Ti/(Ti+Zr) falls within the above-specified range, the value of Ti/(Ti+Zr) being calculated provided that rare earth elements, Bi, Ba, Sr, Ca, Cd, K, Na, and Mg substitute for zirconium, and Nb, Ta, Hf, Fe, Sn, Al, Mn, Cr, W and Ru substitute for titanium. The percent substitution of substitute elements or impurity elements for Pb, Zr and Ti is preferably up to 10%, and more preferably up to 5%. In the PZT thin film, other elements such as Ar, N. H, Cl, C, Cu, Ni, and Pt may be included as trace additives or incidental impurities.

Crystallinity and surface smoothness

The crystallinity of the buffer layer, metal thin film and underlying layer can be evaluated in terms of the half-value width of a reflection peak rocking curve in x-ray diffraction or a pattern of a RHEED image. The surface smoothness can be evaluated by a pattern of a RHEED image or a TEM photomicrograph.

More particularly, each layer preferably has such crystallinity that in x-ray diffractometry, a rocking curve of reflection from (200) face or (002) face (or (400) face in the case of a buffer layer of rare earth c-type structure) may have a half-value width of up to 1.50°. The lower limit of the half-value width of the rocking curve is not critical and the smaller the better. At the present, the lower limit is usually about 0.7° and especially about 0.4°. In the event of RHEED, a spotty image indicates an irregular surface, and a streaky image indicates a flat surface. In either case, a sharp RHEED image indicates good crystallinity.

Forming method

For the formation of the buffer layer and metal thin film, an evaporation, MBE or RF magnetron sputtering process is preferably used, with the process described in JP-A 10-17394 being especially preferred.

Although the invention is most effective when applied to FBAR, it can be applied to piezoelectric devices for use as thin film oscillators for mobile communications, thin film VCO, thin film filters, high-speed frequency synthesizers for frequency hopping, and liquid injectors.

There has been described a thin film piezoelectric device in which the epitaxially grown PZT thin film is optimized in composition and crystal arrangement so that a high performance piezoelectric device such as FBAR operating over an extremely broad band is realized. Improved piezoelectric properties are available without poling of the PZT thin film.

Japanese Patent Application No. 11-139997 is incorporated herein by reference.

Reasonable modifications and variations are possible from the foregoing disclosure without departing from either the spirit or scope of the present invention as defined by the claims.

What is claimed is:

1. A thin film piezoelectric device comprising a silicon substrate, a metal thin film in the form of an epitaxial film on the substrate, and a PZT thin film on the metal thin film, said PZT thin film having a Ti/(Ti+Zr) atomic ratio of from 0.65 to 0.90.

2. The thin film piezoelectric device of claim 1 wherein said PZT thin film is a 90 degree domain structure epitaxial film having (100) orientation and (001) orientation mixed.

3. The thin film piezoelectric device of claim 1 which is a film bulk acoustic resonator.

* * * * *